United States Patent
Andersson et al.

(10) Patent No.: US 8,298,457 B2
(45) Date of Patent: Oct. 30, 2012

(54) METHOD OF PRODUCING A MOVABLE LENS STRUCTURE FOR A LIGHT SHAPING UNIT

(75) Inventors: Gert Andersson, Lindome (SE); Stefan Bengtsson, Särö (SE); Sverker Hård, Hälleviksstrand (SE); Anders Larsson, Billdal (SE); Fredrik Nikolajeff, Stockholm (SE); Henrik Rödjegård, Öjersjö (SE); Anna-Lena Hård, legal representative, Hälleviksstrand (SE)

(73) Assignee: Imego AB, Gothenburg (SE)

( * ) Notice: Subject to any disclaimer, the term of this patent is extended or adjusted under 35 U.S.C. 154(b) by 1021 days.

(21) Appl. No.: 10/531,274

(22) PCT Filed: Nov. 4, 2003

(86) PCT No.: PCT/SE03/01709
§ 371 (c)(1),
(2), (4) Date: Apr. 13, 2005

(87) PCT Pub. No.: WO2004/042442
PCT Pub. Date: May 21, 2004

(65) Prior Publication Data
US 2006/0012849 A1    Jan. 19, 2006

(30) Foreign Application Priority Data
Nov. 5, 2002  (SE) ..................................... 0203266

(51) Int. Cl.
*B29D 11/00* (2006.01)

(52) U.S. Cl. ......... 264/1.24; 216/24; 264/1.31; 264/1.7; 264/2.7

(58) Field of Classification Search ............. 264/1.1, 264/1.24, 1.36, 1.38, 2.7, 1.31, 1.32, 1.37; 359/813, 814; 216/24, 26
See application file for complete search history.

(56) References Cited

U.S. PATENT DOCUMENTS

| | | | |
|---|---|---|---|
| 5,734,490 A | 3/1998 | Rabarot et al. | |
| 5,923,480 A | 7/1999 | Labeye | |
| 6,054,335 A | 4/2000 | Sun et al. | |
| 6,074,888 A | 6/2000 | Tran et al. | |
| 6,091,537 A * | 7/2000 | Sun et al. | 359/248 |
| 6,446,467 B1 | 9/2002 | Lieberman et al. | |

FOREIGN PATENT DOCUMENTS

| | | |
|---|---|---|
| EP | 0 783 107 A1 | 7/1997 |
| JP | 11-72723 A | 3/1999 |
| JP | 2001-155201 * | 6/2000 |
| WO | WO-96/01483 A1 | 1/1996 |

* cited by examiner

*Primary Examiner* — Mathieu D Vargot
(74) *Attorney, Agent, or Firm* — Birch, Stewart, Kolasch & Birch, LLP

(57) ABSTRACT

The invention relates to a method of producing a movable lens structure that comprises the steps of: forming a lens from a lens material disposed on a carrier of another material (step 58), and forming a micromechanical structure from the carrier (step 60), wherein the forming of the lens takes place before the forming of the micromechanical structure. With this method a simplified production method is obtained that simplifies difficult compatibility requirements between micromechanics and lens that can otherwise be hard to meet.

13 Claims, 8 Drawing Sheets

METHOD OF PRODUCING A MOVABLE LENS STRUCTURE FOR A LIGHT SHAPING UNIT

TECHNICAL FIELD OF THE INVENTION

The present invention relates to the production of optical components and preferably to the production of optical components that comprise a movable micromechanical device with a light shaping unit.

DESCRIPTION OF RELATED ART

In the production of optical components and preferably components comprising micromechanical positioning devices it is known to use a lens in such an arrangement, see for example U.S. Pat. No. 5,734,490 and U.S. Pat. No. 5,923,480.

In U.S. Pat. No. 5,734,490 it is also described how the production of a lens and micromechanics can be achieved. Here the micromechanical structure comprises arms that are connected to a lens from the side. The lens is formed first followed by the forming of the mechanical structure. This is possible since the arms stretch out on the side of the lens. The lens is here formed from the same transparent material as the arms.

In U.S. Pat. No. 5,923,480 an example is provided on how to produce a lens and structure. Here the forming of a part of the micromechanical structure in the form of arms holding the lens is taking place together with the forming of the lens, followed by the forming of the rest of the micromechanical structure. Also here, the arms and lens are formed from the same material. In this document it is furthermore hard to vary the lens structure, which is in the form of a cylinder. In order to provide a light passage channel below the lens, it is also required that this is formed when the material that is to become the lens and arms is deposed on a substrate.

U.S. Pat. No. 6,074,888 and U.S. Pat. No. 5,097,354 describe lenses that are used in optical systems, but without being arranged as a compact component also including micromechanics.

U.S. Pat. No. 6,054,335 describes a movable laser in a component that can also include a lens. The lens is however presumably placed on the structure after the forming of the other parts of the structure.

SUMMARY OF THE INVENTION

The present invention is directed towards solving the problem of providing a way to produce a movable structure for a light shaping unit that enables simplified production of the light shaping unit on a micromechanical compared with the prior art.

This is achieved through a method of producing a compact movable structure for a light shaping unit comprising the steps of: forming a light shaping unit from a material provided on a carrier of another material, and forming a micromechanical structure from the carrier, whereby the forming of the light shaping unit is performed before the forming of the micromechanical structure.

Through the production method according to the invention compatibility demands between micromechanics and light shaping unit that are otherwise hard to meet are simplified. Through the method according to the invention later assembly of the light shaping unit is also avoided, which can be an expensive processing step.

Because the light shaping units are, according to one embodiment of the present invention, produced through embossing, these can be produced using mass production, which lowers the cost of the structure.

The general idea of the invention is thus based on the fact that in the production of a movable structure for a light shaping unit, a light shaping unit is first formed on a substrate and only thereafter the micromechanics is formed.

BRIEF DESCRIPTION OF THE DRAWINGS

The present invention will in the following be described with reference being made to the accompanying drawings, where FIG. 1 schematically shows a perspective view of an optical component having a first type of micromechanical construction.

DETAILED DESCRIPTION OF EMBODIMENTS

The present invention relates to the production of a movable light forming unit in the form of a lens and then preferably of a lens with a corresponding micromechanical structure that moves the lens such that light from an optical component that is connected to the movable lens can be deflected.

Figure 1:
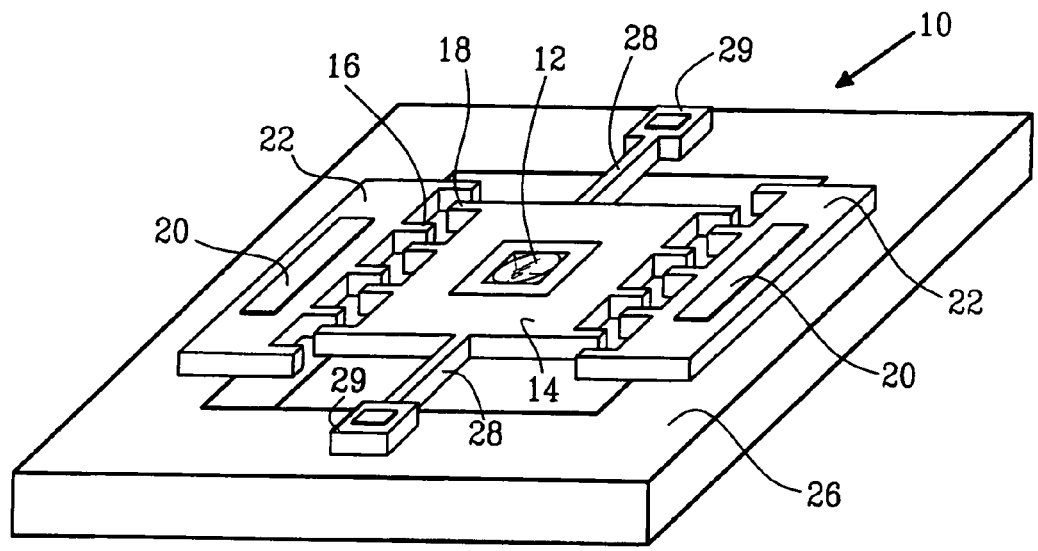

FIG. 1 schematically shows a circuit 10 produced according to the invention in a perspective view. An optical component in the form of a laser, optical detector or optical fibre (not shown) is provided in a wafer 26, on which wafer a micromechanical device is provided comprising a rectangular intermediate plate 14 and two opposed side plates 22. A lens 12 is provided on the intermediate plate. The intermediate plate is equipped with teeth 18 that mate with cavities between corresponding teeth 16 on the two side plates 22. The side plates 22 each comprise a contact 20 that is used for controlling the micromechanical device. The intermediate plate 14 is suspended by two opposite supporting points 29 via two elastic arms 28, which supporting points and arms also form part of the micromechanical structure. The teeth 18 are disposed on two opposing sides of the rectangular intermediate plate, while the elastic arms 28 are disposed on the two remaining opposite sides of the intermediate plate 14. In the figure the arms have a straight structure.

Figure 2:
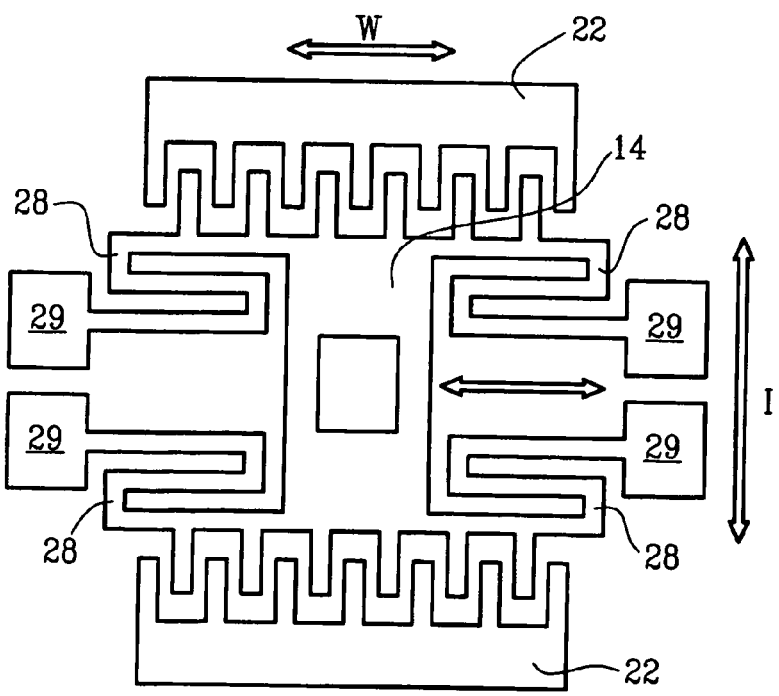
FIG. 2 shows a top view of a second type of micromechanical construction, FIG. 3 schematically shows a sectional view of a complete component.

FIG. 2 shows a top view of a preferred embodiment of the micromechanical structure. The difference from FIG. 1 is that each side of the intermediate plate 14 that has arms 28, has arms with a folded zigzag structure in order to simplify resilience when moving the intermediate plate 14. In a corresponding manner each arm is provided with a corresponding support point. The construction according to FIG. 2 thus has four supporting points 29.

Figure 3:
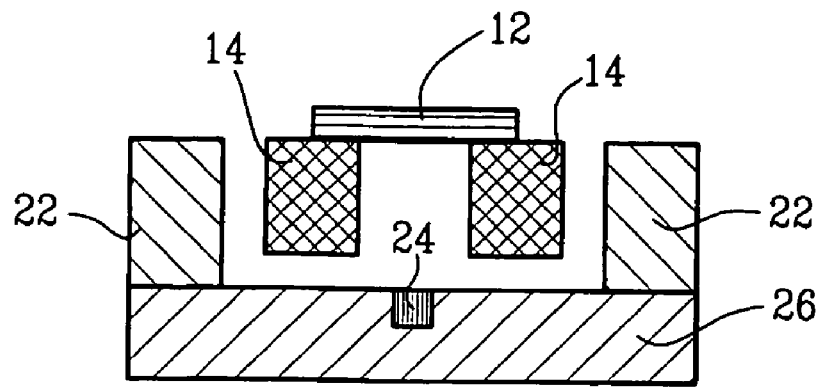

FIG. 3 schematically shows a sectional view of the device according to FIG. 1 or 2. Here the wafer 26 is shown, which includes a semiconductor laser 24. The micromechanical device is placed with the two side plates 22 and the intermediate plate 14 above the laser. The lens 12 is placed on the intermediate plate 14, which plate is provided with a cavity or light passage channel between lens and laser, in order to allow light to be sent from the laser and focussed by the lens 12. In operation the intermediate plate can be made to move in a horizontal direction because of electrical voltages that have been applied on the contacts 20 and because of the elasticity of the arms shown in FIGS. 1 and 2. In this way the lens can ensure that the laser beam is deflected or scanned in different directions. This can be performed either in the right direction or in the left direction in dependence of how the intermediate plate 14 is moved. The component according to the invention can therefore be used in a multitude of ways, of which some will be mentioned later.

How the device is produced according to a preferred method will now be described with reference being made to FIG. 4-13 that show sectional views of different substrates and layers in the production of the micromechanics and lens.

Figure 4:
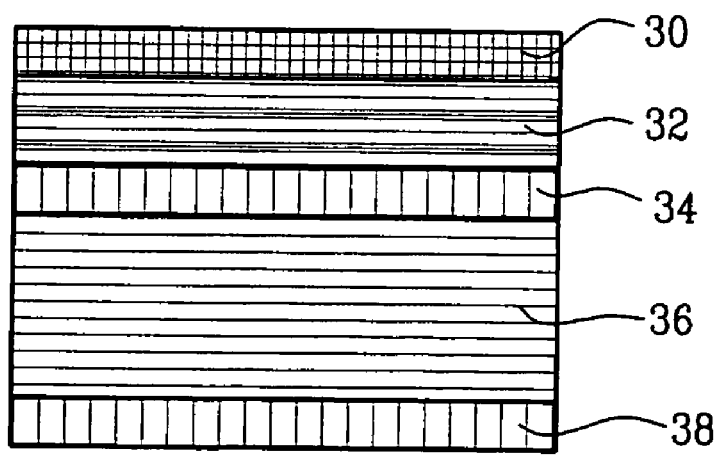
FIG. 4-13 show sectional views on different production steps in the production of a component according to the invention, FIG. 14 schematically shows the embossing of a lens.

First a layer of lens material 30 with a thickness of about 3-5 μm is applied on a carrier or a substrate. The carrier comprises a first silicon layer 32 of thickness 10 μm. Under the first silicon layer 32 there is a layer 34 of silica with a thickness of about 1-2 μm. Under the silica 34 there is a second silicon layer 36 of thickness 500 μm. Under the second silicon layer there is a layer of backside oxide 38. The lens material 30 is preferably in the form of a polymer and in the preferred embodiment CYTOP. An alternative to CYTOP is Parylene. A preferred way to apply the lens material is through spin coating, although other ways are of course also possible, such as for example chemical deposition or spray coating. The carrier with lens material 30 is shown in FIG. 4.

Thereafter the lens is formed in the lens material 30, which is preferably done through embossing. In the embossing, the lens material is heated to about 80-110 degrees centigrade and then the lens is embossed using a stamp. The lens can for instance have a diffractive structure, although also other types of lens structures are possible such as pure convex or pure concave lenses.

Figure 5:
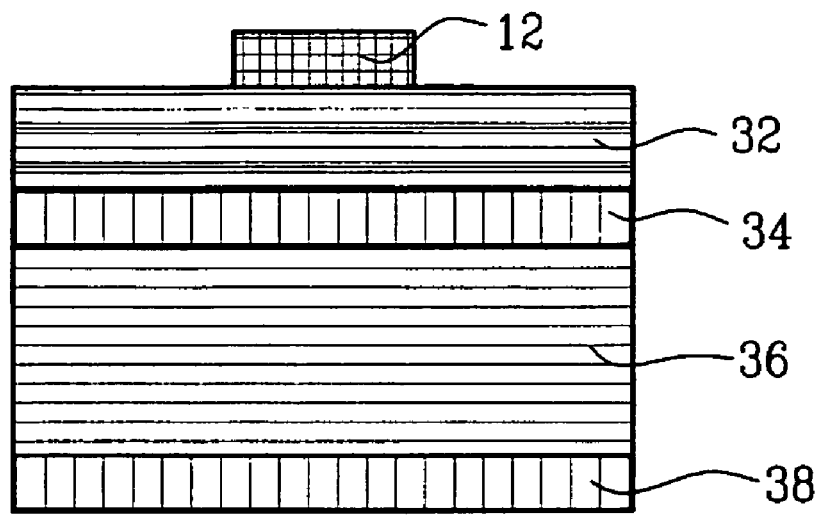

Thereafter a photo resist is applied over the lens material, for instance AZ-4562. The photo resist is printed through photolithography, i.e. it is illuminated. After development of the photo resist, resist in the form of a mask remains only above the areas that are to remain, i.e. the lens itself. Hereafter etching of the lens material follows using an $O_2$-plasma in order to remove superfluous lens material. After the etching the mask is removed, for instance using acetone. The finished lens 12 is left on the carrier, which is shown in FIG. 5. What has been described here is thus normal photolithography.

Figure 6:
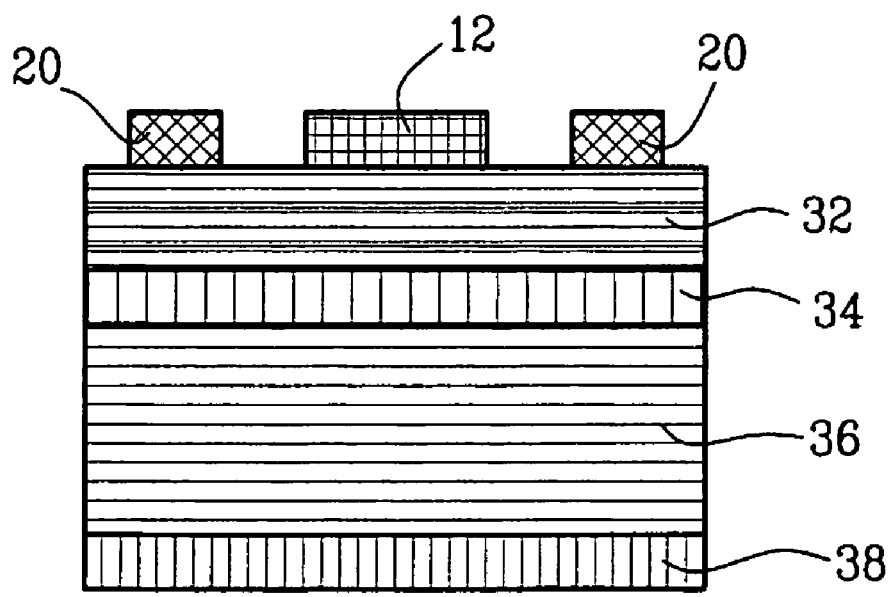

After the lens has been finalised, the method of production continues with metallization of contacts. Metal is applied in the form of gold/chromium or alternatively aluminium over the whole wafer, for instance through a vaporisation—or sputtering process. Metal contacts are thereafter created using a photolithography process, i.e. through putting a mask on the areas that are to remain (positive resist). The superfluous metal is then etched away using a suitable metal etch. FIG. 6 shows the contacts 20 provided in this way together with the lens 12 on the carrier with the two silicon layers 32 and 36 as well as oxide layers 34 and 38.

Figure 7:
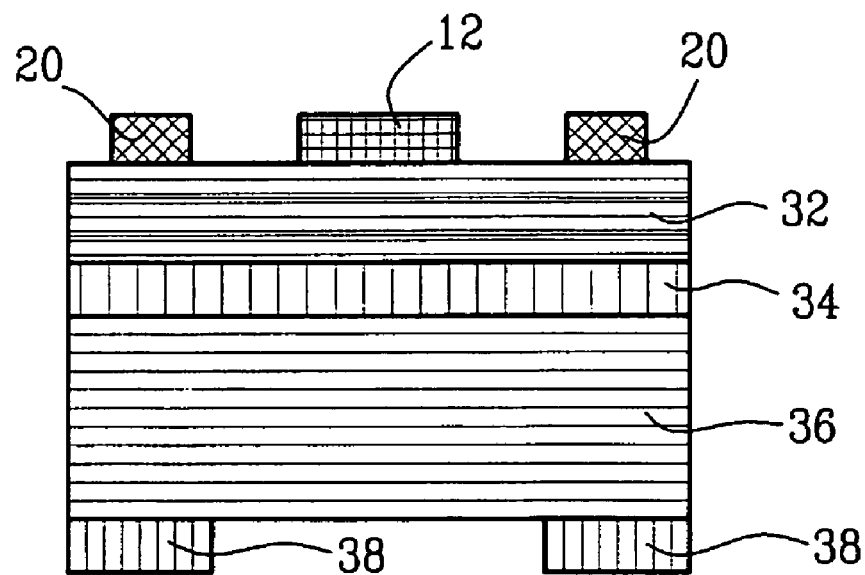

Thereafter an opening is formed through the backside of the carrier using photolithography and etching, i.e. through providing a mask on the outer parts of the backside oxide 38 and then etching away oxide in the middle. The mask is removed after the etching. The structure after the etching is shown in FIG. 7.

Figure 8:
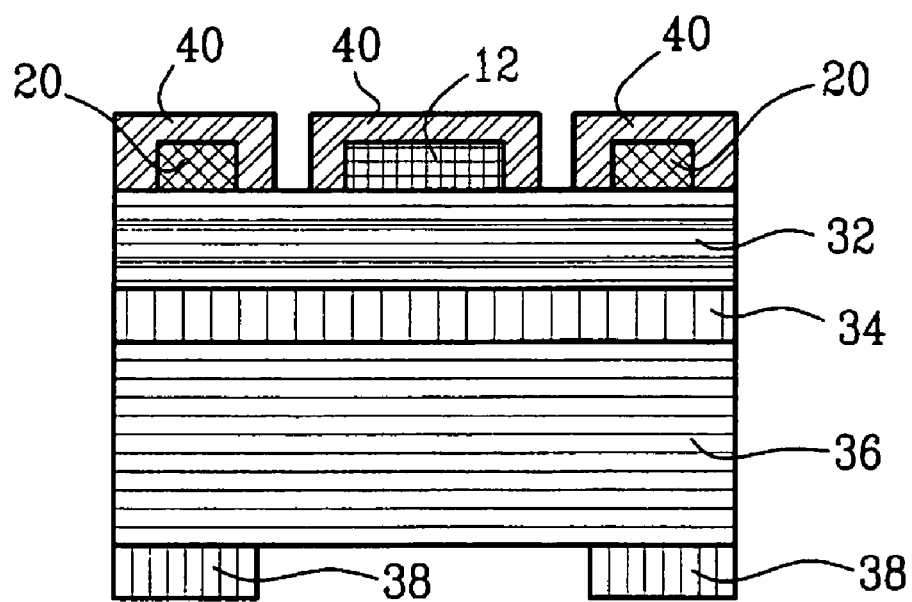
Figure 9:
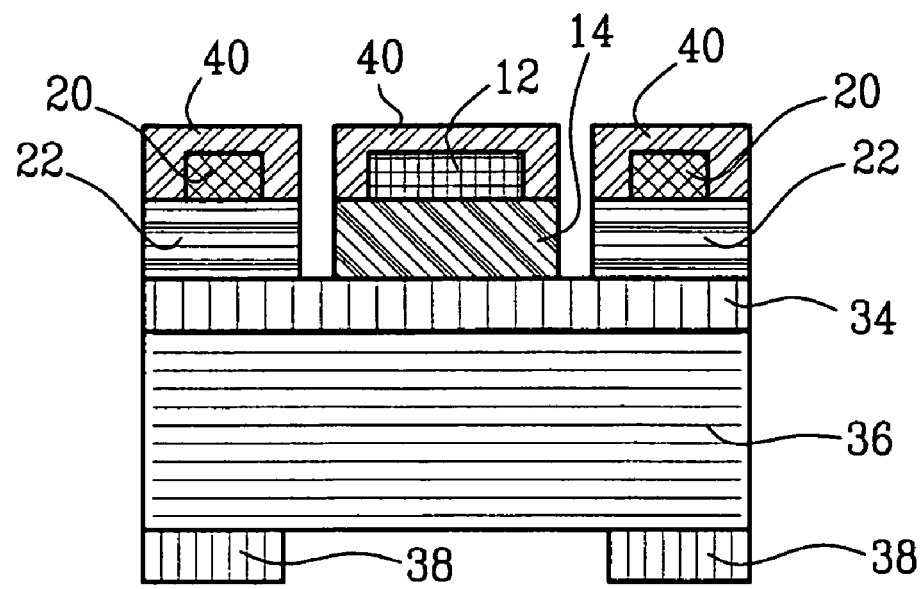

Thereafter it is time to form the mechanical pattern in the form of the finger structure and the resilient legs that appear in FIGS. 1 and/or 2. The micromechanical structure is thus formed now, but without releasing the intermediate plate. It can thus not yet be moved after this step. This is performed through applying a resist 40 on the top of the carrier on the parts 20, 12 where material is not to be removed. The resist is then placed where the mechanical pattern is to be obtained. This is shown in FIG. 8.

After such a mask has been formed, the non-covered silicon material is etched away using plasma etching. As is apparent from FIG. 9 a large part of the silicon layer 32 above the oxide layer 34 has been etched away. In this way the structure shown in FIGS. 1 and/or 2 has been obtained with the intermediate plate 14 and elastic arms 28 that connect the intermediate plate 14 with the side plates 22. After this the resist is stripped away in a known way.

Figure 10:
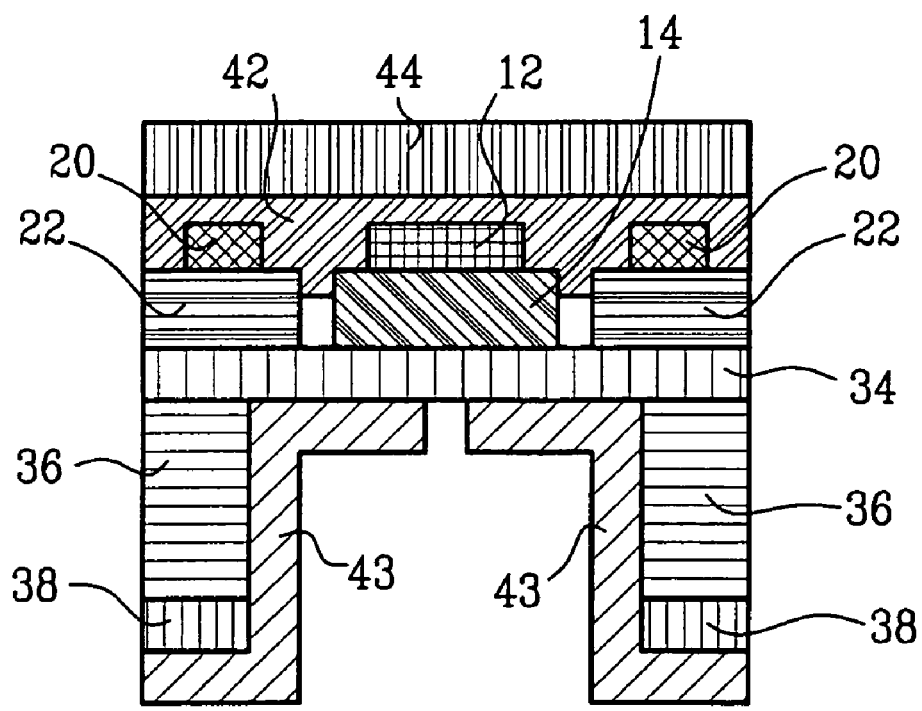

Hereafter a temporary protective layer is mounted on the topside of the structure. First a resist layer 42 and then a silicon layer 44. This is in the preferred embodiment performed through "gluing" a wafer comprising silicon layer 44 and resist layer 42 on the lens and micromechanics. By this operation the lens 12 and contacts 20 are fixed with the aid of the resist layer 42. After this follows etching from below in order to create a cavity under the inner oxide layer 34. In this etching, the lower oxide layer 34 functions as a mask. Thereafter a resist 43 is applied through spraying, for instance maP-215s with ethyl acetate, on the bottom side with the exception of an area straight under the lens, in order to allow the creation of a passage for a laser beam. The structure with this resist layer is shown in FIG. 10.

Figure 11:
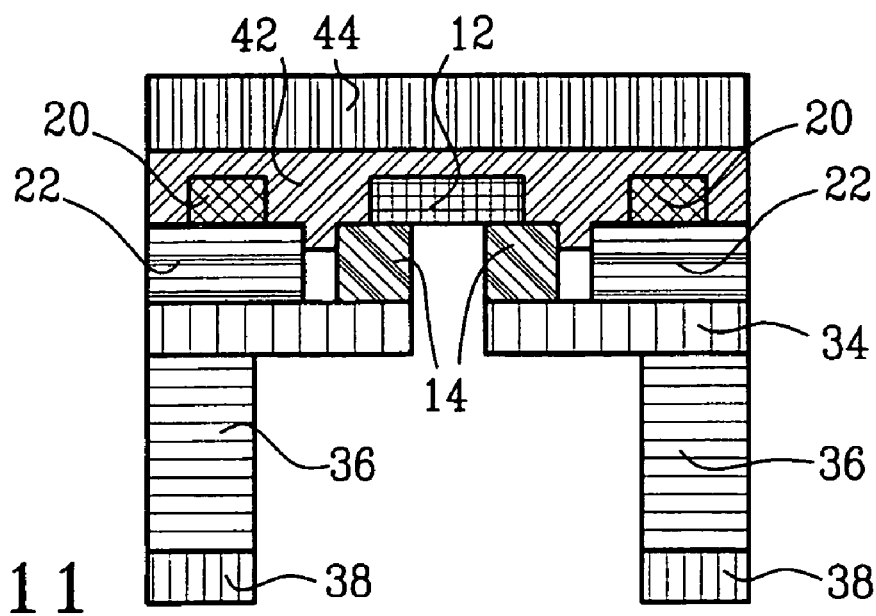

Thereafter the cavity up to the lens 10 is created, first through oxide etching through the oxide layer 34 followed by silicon etching through the intermediate plate 14. The etching is normally performed in such a way that the whole structure is dipped in an oxide etch. After this etching the resist layer 43 is stripped away. The result of this is shown in FIG. 11. A light passage channel has thereby been created through the micromechanical structure up to the lens and that can be used by a later provided optical component. The lens has here functioned as an etch stop, thus making extra stop layers unnecessary.

Figure 12:
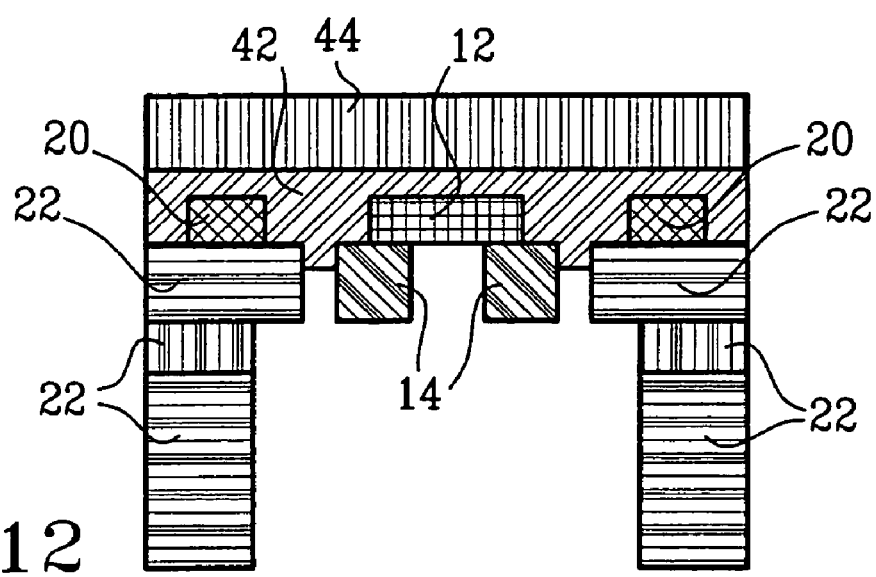

Thereafter follows an oxide etching from below so that the lowest oxide layer 38 is removed and non-covered parts of the in-built oxide layer 34 are removed. The result is shown in FIG. 12.

Figure 13:
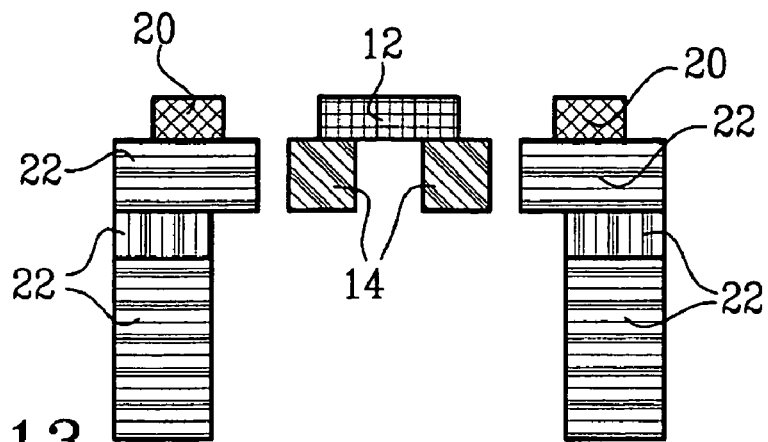

Finally the resist layer 22 is removed through dipping the construction in acetone. The uppermost silicon layer 44 is then provided in the form of a wafer, which can be lifted off. The result is shown in FIG. 13, which thus shows the final micromechanical structure with the lens.

The structure is rinsed in water, dipped in IPA (Isopropanole alcohol) and dried. Thereafter the obtained structure is mounted on an optical component, which is substrate 26 comprising a laser 24, optical detector or an optical fibre, depending on which type of device that is needed, see FIG. 3, and the structure is bonded.

Figure 14:
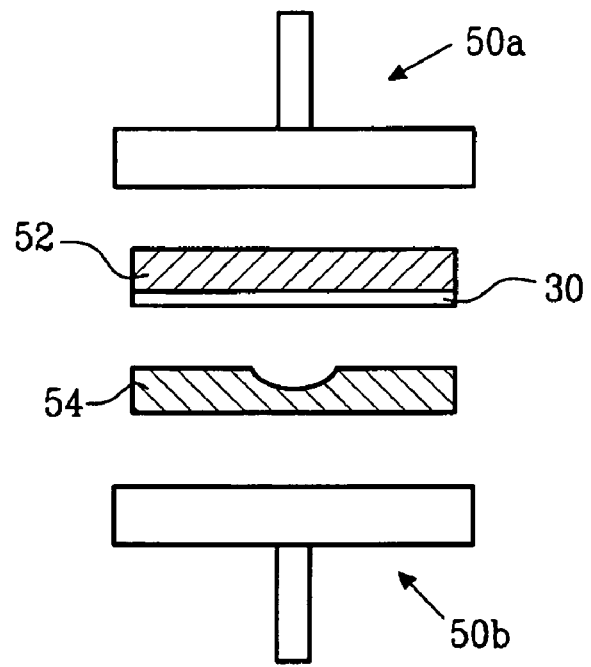
Figure 15:
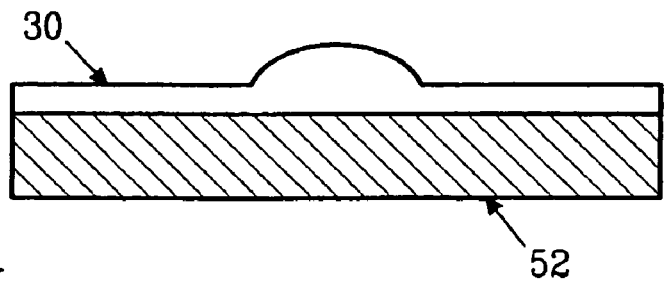
FIG. 15 shows the embossed lens on a substrate.

A more detailed description of the embossing process will now be given with reference being made to FIG. 14, which schematically shows two hot plates 50a and 50b, between which a silicon wafer 50 or carrier, on top of which a polymer film has been spun, and a nickel mould 54 facing the lens material have been placed. This carrier corresponds to the carrier shown in FIG. 4. The nickel mould 54 is formed as a plate with a cavity corresponding to the lens structure the resulting lens is to have. The embossing process is carried out in such a way that first the nickel mould 54 is inserted between the two hot plates 50a and 50b and thereafter the silicon wafer 52 with the lens material 30 is directly inserted against the mould 54 between the two hot plates 50a and 50b with the lens material facing the mould 54. Thereafter pressure is applied against the two hot plates 50a and 50b, which gives as a result that the wafer 52 with lens material 30 is pressed against the mould 54. The temperature of the hot plates 50a and 50b is increased, which gives as a result that the lens material is starting to soften and adapt to the mould 54, i.e. is pressed into the cavity of the mould 54. Thereafter the temperature is decreased and the pressure is lowered such that the silicon wafer 52 with polymer material 30 can be removed from the mould 54. In this way the lens material receives the inverted curvature of the mould, which curvature is shown in FIG. 15.

The final device can be a laser source where a laser beam generated by the laser is scanned, an optical detector that receives a laser beam or an optical fibre that transmits a laser beam generated by a laser all depending on the application.

The device according to the invention has many applications. It can be used for scanning a laser beam, which can be useful when detecting fluorescence in DNA or cell analysis. The invention can also be used when testing retinas in a hand-held ophthalmoscope. Another field of use is to have one ore more such devices in an optical exchange.

Figure 16:
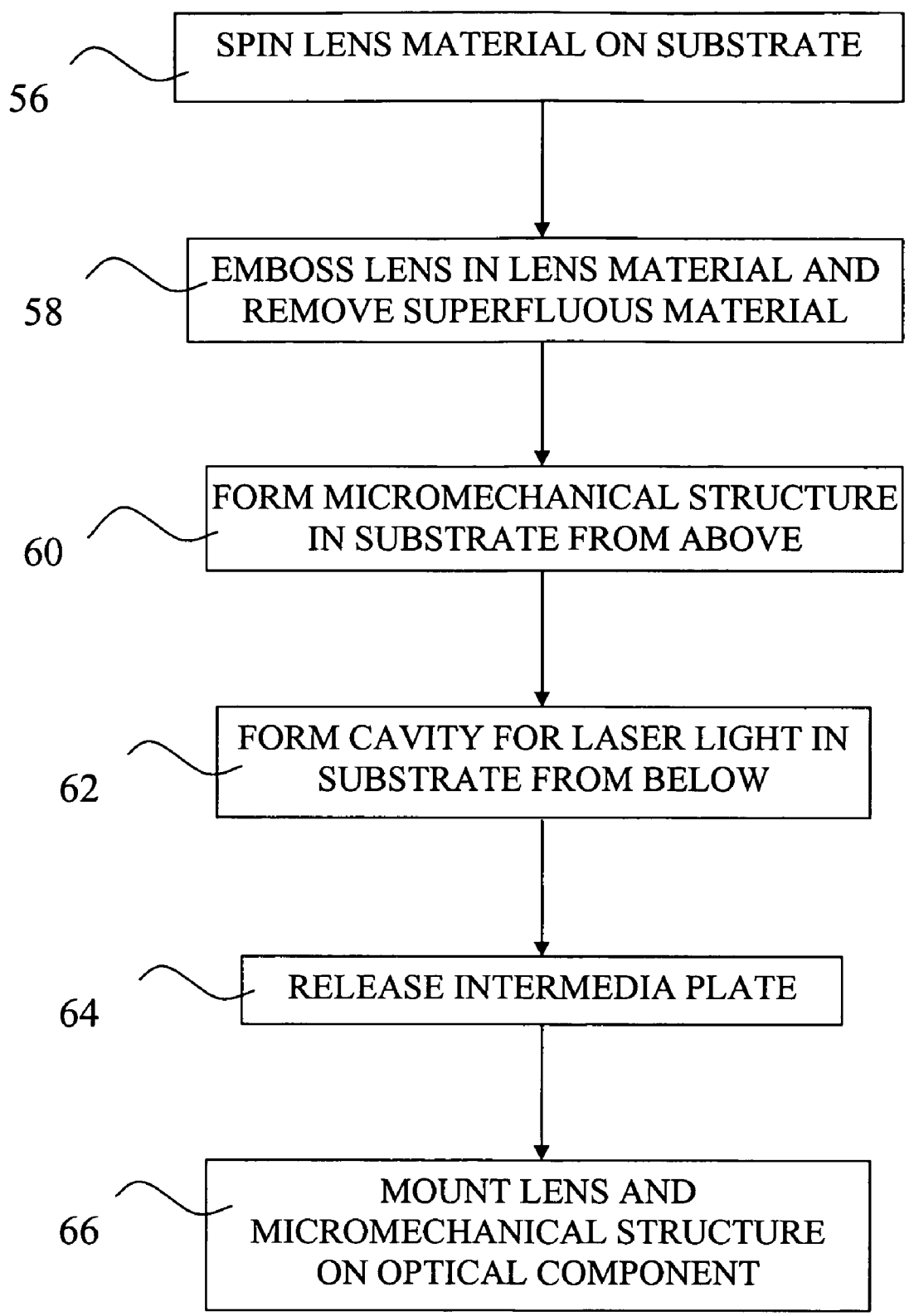
FIG. 16 shows a flow chart of different production steps in the method according to the invention.

Finally the method of production will be schematically described with reference being made to FIG. 16, which shows a flow chart of the method of production.

First the lens material in the form of a polymer is spun on a carrier or a substrate, step 56. Thereafter the lens is embossed in the lens material and superfluous lens material is removed, step 58. The micromechanical structure is thereafter formed in the substrate or carrier from the topside of the structure, i.e., from the side the lens is placed on, step 60. This is followed by the forming of a light passage channel through the structure or substrate from the underside, i.e. up to the lens, step 62. When the light passage channel is finished the intermediate plate is released such that it can be moved, step 64. Finally the lens and the micromechanical structure is mounted on an optical component and bonded, step 66.

It is apparent that several alternative ways of proving the micromechanical structure are possible than what has been described. There are also several alternative ways to apply the lens material than through spin coating. Metal contacts can for example be provided afterwards when the micromechanical structure has already been formed. The light passage channel can also as an alternative be created through wet etching instead of plasma etching.

The lens material and micromechanical structure are suitable selected according to the wavelength area that the optical component to be employed uses. The used lens material is preferably a polymer.

Above was described the movement of the lens in one dimension between a left and a right position through the micromechanical structure. It is also possible to provide the micromechanical structure in such a way that the lens can be moved in two dimensions through the provision of further teeth and cavities on the other sides of the intermediate plate.

The embossing process can also be varied. The mould does for instance not have to be a nickel mould, but also other metals can be used. The order in which mould and substrate are inserted between the hot plates can also be varied. They can also be inserted simultaneously.

Through the production method according to the invention, where the forming of the light shaping unit in a material takes place before the forming of the micromechanical structure in another material, it is possible to form a light shaping unit with an underlying micromechanical structure in a simple way and that does not have any difficult compatibility requirements between forming of micromechanics and forming of light shaping unit. Expensive later mounting of individual elements in the light shaping unit is also avoided.

Through using different materials for the light shaping unit and micromechanics these can be optimised for best performance considering the optical properties and robustness/reliability of the mechanics.

The material for the light shaping unit is preferably a polymer and then preferably CYTOP, which makes it possible to mass produce the light shaping units through embossing, a very cost-efficient technique.

The light shaping unit is in the preferred embodiment a lens. However, other types of units are also possible like gratings, diffractive optical components, Fresnel lenses, phase holograms or kinoforms.

The light passage channel is in the described embodiment provided as a cavity where light can pass freely. It can however as an alternative be provided in the form of a waveguide.

The micromechanical structure is preferably formed from silicon because of its low cost. Other materials can however of course also be contemplated.

The present invention is only to be limited by the following claims.

The invention claimed is:

1. A method of producing a compact movable structure for a light shaping unit comprising the steps of:
   forming a light shaping unit through embossing from a layer of polymer material provided on a carrier of another material; and
   subsequently forming, from said carrier, an intermediate micromechanical plate for movably supporting the light shaping unit in a micromechanical structure,
   subsequently forming a cavity through the micromechanical structure up to the light shaping unit by etching, and wherein the light shaping unit serves as an etch stop in the forming of the cavity.

2. The method according to claim 1, further comprising depositing the material for the light shaping unit on the carrier.

3. The method according to claim 2, further comprising spinning the material for the light shaping unit on the carrier.

4. The method according to claim 1, wherein the micromechanical structure is formed under the light shaping unit.

5. The method according to claim 4, wherein the forming of the micromechanical structure comprises forming the structure from above.

6. The method according to claim 1, wherein the forming of the cavity comprises etching from the bottom of the carrier in a direction towards the light shaping unit in order to provide a light passage channel.

7. The method according to claim 6, further comprising:
   attaching an optical component to the bottom side of the micromechanical structure in order to enable the projection of light on or the reception of light from the light shaping unit through the light passage channel.

8. The method according to claim 6, wherein the light passage channel is the cavity.

9. The method according to claim 6, wherein the light passage channel is a waveguide.

10. The method according to claim 1, wherein the carrier comprises silicon.

11. The method according to claim 1, wherein the light shaping unit is a lens.

12. The method according to claim 1, wherein the cavity is a waveguide.

13. The method according to claim 1, wherein the light shaping unit is selected from a group consisting of gratings, Fresnel lenses, phase holograms and kinoforms.

* * * * *